US012568634B2

(12) United States Patent
Woo et al.

(10) Patent No.: US 12,568,634 B2
(45) Date of Patent: Mar. 3, 2026

(54) SEMICONDUCTOR DEVICE INCLUDING CAPACITOR AND METHOD FOR FABRICATING THE SAME

(71) Applicant: SK hynix Inc., Gyeonggi-do (KR)

(72) Inventors: Jung Wook Woo, Gyeonggi-do (KR); Sei Yon Kim, Gyeonggi-do (KR); Min Chul Sung, Gyeonggi-do (KR); Yeon Gyu Lee, Gyeonggi-do (KR); Do Hee Kim, Gyeonggi-do (KR); Ja Yong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 410 days.

(21) Appl. No.: 18/300,388

(22) Filed: Apr. 14, 2023

(65) Prior Publication Data

US 2024/0145531 A1     May 2, 2024

(30) Foreign Application Priority Data

Nov. 2, 2022     (KR) ......................... 10-2022-0144221

(51) Int. Cl.
| | |
|---|---|
| *H10D 1/00* | (2025.01) |
| *H01L 21/02* | (2006.01) |
| *H10B 12/00* | (2023.01) |
| *H10D 1/68* | (2025.01) |

(52) U.S. Cl.
CPC ....... *H10D 1/042* (2025.01); *H01L 21/02181* (2013.01); *H01L 21/02189* (2013.01); *H01L 21/022* (2013.01); *H10B 12/033* (2023.02); *H10B 12/31* (2023.02); *H10D 1/696* (2025.01); *H10D 1/716* (2025.01)

(58) Field of Classification Search
CPC ......... H01L 21/02181; H01L 21/02189; H01L 21/022; H10D 1/696
See application file for complete search history.

(56) References Cited

U.S. PATENT DOCUMENTS

| | | | |
|---|---|---|---|
| 2018/0240804 A1* | 8/2018 | Yoo .................. | H01L 21/02189 |
| 2022/0020862 A1* | 1/2022 | Zheng .............. | H01L 21/02181 |

FOREIGN PATENT DOCUMENTS

| | | |
|---|---|---|
| KR | 10-2020-0071852 A | 6/2020 |
| KR | 10-2021-0037973 A | 4/2021 |

OTHER PUBLICATIONS

Shuaidong Li et al., Involvement of Unsaturated Switching in the Endurance Cycling of Si-doped HfO2 Ferroelectric Thin Films, Advanced Electronic Materials, 2020, 2000264, pp. 1-11.
Milan Pesic et al., Physical Mechanisms behind the Field-Cycling Behavior of HfO2-Based Ferroelectric Capacitors, Advanced Functional Materials, 2016, 26, pp. 4601-4612.

* cited by examiner

*Primary Examiner* — Jose R Diaz
(74) *Attorney, Agent, or Firm* — IP & T GROUP LLP

(57) ABSTRACT

A method for fabricating a semiconductor device includes: forming a first oxide layer containing a first element over a first electrode layer; forming a second oxide layer containing a second element over the first oxide layer; forming a stacked structure in which a plurality of first oxide layers and a plurality of second oxide layers are alternately stacked by repeating the forming of the first oxide layer and the forming of the second oxide layer a plurality of times; and forming a second electrode layer over the stacked structure, wherein a thickness of a lowermost first oxide layer among the plurality of first oxide layers is greater than a thickness of each of other first oxide layers.

13 Claims, 5 Drawing Sheets

SEMICONDUCTOR DEVICE INCLUDING CAPACITOR AND METHOD FOR FABRICATING THE SAME

CROSS-REFERENCE TO RELATED APPLICATION

This application claims priority under 35 U.S.C. § 119 to Korean Patent Application No. 10-2022-0144221 filed on Nov. 2, 2022, which is incorporated herein by reference in its entirety.

BACKGROUND

1. Technical Field

Embodiments of the present disclosure relate generally to a semiconductor technology and, more particularly, to a semiconductor device including a capacitor and a method for fabricating the same.

2. Related Art

Recently, with the miniaturization of electronic devices, the space occupied by unit elements such as a transistor and a capacitor is also miniaturized. Even in the miniaturization of the device, a material capable of exhibiting excellent operating characteristics is required.

A high-k material having high capacitance and low leakage current is required as a dielectric material of the capacitor. In particular, when the high-k material has ferroelectricity, power consumption of the electronic device including the capacitor can be greatly reduced due to a negative capacitance effect. Thus, improved technologies are needed to resolve issues arising out of the increased miniaturization of the semiconductor devices.

SUMMARY

In an embodiment of the present disclosure, a method for fabricating a semiconductor device, may include: forming a first oxide layer including a first element over a first electrode layer; forming a second oxide layer including a second element over the first oxide layer; forming a stacked structure in which a plurality of first oxide layers and a plurality of second oxide layers are alternately stacked by repeating the forming of the first oxide layer and the forming of the second oxide layer a plurality of times; and forming a second electrode layer over the stacked structure, wherein a thickness of a lowermost first oxide layer among the plurality of first oxide layers is greater than a thickness of each of other first oxide layers.

In another embodiment of the present disclosure, a semiconductor device may include: a first electrode layer; a dielectric layer over the first electrode layer; and a second electrode layer over the dielectric layer, wherein the dielectric layer comprises: a first oxide layer including a first element; a second oxide layer formed over the first oxide layer and including the first element and a second element different from the first element; a third oxide layer formed over the second oxide layer and including the second element; and a fourth oxide layer formed over the third oxide layer and including the first element and the second element. Here, a thickness of each of the first oxide layer and the third oxide layer is smaller than a thickness of the second oxide layer. The fourth oxide layer is formed of the same material as the second oxide layer. A thickness of the fourth oxide layer is greater than a thickness of the second oxide layer. The first oxide layer includes hafnium oxide, wherein the third oxide layer includes zirconium oxide, and wherein the second and fourth oxide layers include hafnium zirconium oxide. The second and fourth oxide layers have ferroelectricity. The first electrode layer, the second electrode layer, and the dielectric layer form a capacitor, and the semiconductor device further comprises: a transistor electrically connected to the capacitor.

In another embodiment of the present disclosure, a semiconductor device may include: a first electrode layer; a stacked structure disposed over the first electrode layer and in which a plurality of first oxide layers including a first element and a plurality of second oxide layers including a second element are alternately stacked; and a second electrode layer disposed over the stacked structure, wherein a thickness of a lowermost first oxide layer among the plurality of first oxide layers is greater than a thickness of each of other first oxide layers.

In another embodiment of the present disclosure, a semiconductor device may include: a capacitor having a dielectric layer comprising first to fourth oxide layers stacked sequentially on each other, wherein the first and third oxide layers include first and second elements respectively, and wherein the second and fourth oxide layers each includes the first and the second elements.

DETAILED DESCRIPTION

Figure 1:
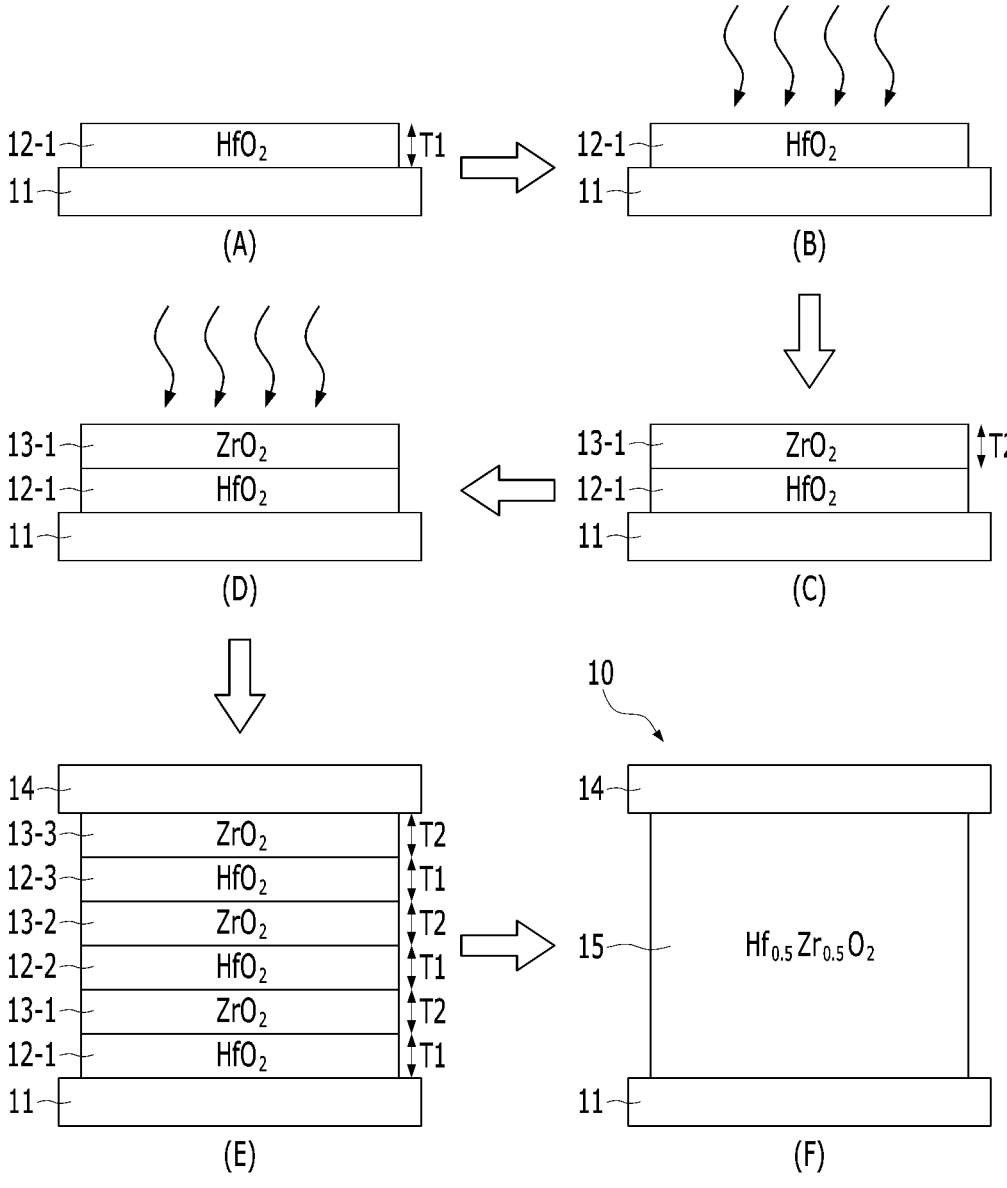
FIG. 1 is a simplified schematic illustrating a capacitor of a semiconductor device of a comparative example, and a manufacturing method thereof according to an embodiment of the present disclosure.

Hereinafter, various embodiments of the present disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Referring now to FIG. 1, a comparative example of a capacitor of a semiconductor device and a manufacturing method thereof according to an embodiment of the present disclosure are provided. More specifically, FIG. 1(F) shows a capacitor, and FIGS. 1(A) to 1(E) show the intermediate process operations employed in a manufacturing process for the capacitor of FIG. 1(F).

Referring now to FIG. 1(F), a capacitor 10 may include a first electrode layer 11, a second electrode layer 14, and a dielectric layer 15 interposed between the first electrode layer 11 and the second electrode layer 14.

The first electrode layer 11 and the second electrode layer 14 may be made of any suitable conductive material. The first electrode layer 11 and the second electrode layer 14 may be made of the same or different conductive material. For example, each of the first and second electrode layers 11 and 14 may be made of or include a metal, including, for example, platinum (Pt), tungsten (W), aluminum (Al), copper (Cu), tantalum (Ta), titanium (Ti), nickel (Ni), and molybdenum (Mo), a metal nitride such as titanium nitride (TiN) and tantalum nitride (TaN), or any combination thereof.

The dielectric layer 15 may be made of any suitable material including, for example, an oxide. The oxide may include a first element and a second element. Here, the dielectric layer 15 may have a ferroelectric property depending on the type of the first element and the second element, the content of the first element, the second element, and oxygen, and the thickness of the dielectric layer 15. For example, the dielectric layer 15 may be made or include hafnium zirconium oxide ($Hf_xZr_yO_z$). The hafnium zirconium oxide may have a ferroelectric property when hafnium zirconium oxide satisfies x=y=0.5 and z=2, and the thickness thereof is 10 nm or less. However, the present disclosure is not limited thereto, and the type of the first and second elements, the content of the first and second elements, and the target thickness of the dielectric layer 15 may be variously modified. When the dielectric layer 15 has ferroelectricity, information stored in the capacitor 10 may be maintained due to a spontaneous polarization characteristic of a ferroelectric material, even if the power supply to the semiconductor device is interrupted or stopped.

A manufacturing method of the capacitor 10 will be described below.

Referring now to FIG. 1(A), a first oxide layer 12-1 including the first element may be formed over the first electrode layer 11. Here, the first element may be one of the constituent elements of the aforementioned dielectric layer 15, except for oxygen. For example, the first oxide layer 12-1 may include hafnium oxide, for example, $HfO_2$, and may have a thickness T1. The forming process of the first oxide layer 12-1 may be performed by an atomic layer deposition (ALD) method, which will be described in detail with reference to FIG. 2 below.

Figure 2:
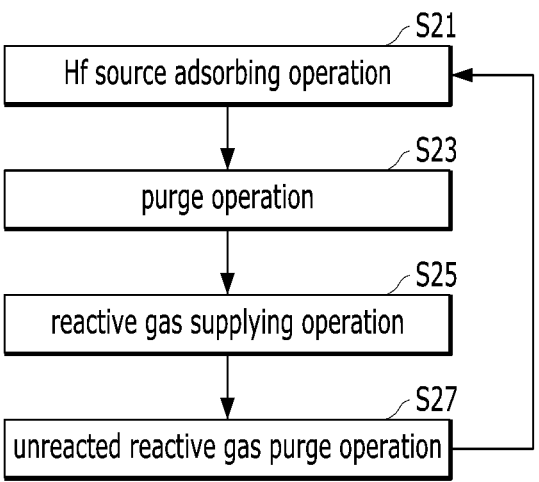
FIG. 2 is a flowchart illustrating a process for forming a first oxide layer of FIG. 1 according to an embodiment of the present disclosure.

FIG. 2 is a flowchart illustrating a process for forming a first oxide layer of FIG. 1 according to an embodiment of the present disclosure.

Referring to FIG. 2, the method may include a first Hf source adsorbing operation S21 which includes supplying a source of the first element, for example, the hafnium source, into a chamber in which the first electrode layer is formed, and adsorbing it onto the first electrode layer. The hafnium source may be made of or include, for example, Tetrakis EthylMethylAmino Hafnium (TEMAH), Tetrakis DiEthyl-Amino Hafnium (TDEAH), Tetrakis DiMethylAmino Hafnium (TDMAH), or the like.

Subsequently, a purge operation S23 including removing an unadsorbed hafnium source may be performed.

Subsequently, a reactive gas supplying operation S25 is performed which includes supplying the reactive gas into the chamber and reacting the reactive gas with the adsorbed hafnium source in the chamber. The reactive gas may be or include an oxidizing agent. The oxidizing agent may include, for example, a gas or plasma including O3, O2, H2O, H2O2, or a combination thereof.

Subsequently, a purge operation S27 may be performed for removing an unreacted reactive gas.

The operations S21 to S27 may be repeatedly performed until the first oxide layer 12-1 has the desired thickness T1. The operations S21 to S27 may be regarded as one cycle, and, thus, a plurality of cycles may be performed until the first oxide layer 12-1 reaches a desired thickness T1.

Referring to FIGS. 1, and 1(B), an additional oxidation process may be performed on the first oxide layer 12-1 indicated by the arrows. The dielectric layer 15 may include the oxide of the first element and the second element, for example, hafnium zirconium oxide, and ferroelectricity may be exhibited by a non-centrosymmetric lattice of oxygen anions. Therefore, a ferroelectric property may be secured by compensating for oxygen vacancies in the first oxide layer 12-1 through this additional oxidation process.

Referring to FIG. 1(C), a second oxide layer 13-1 including a second element may be formed over the additionally oxidized first oxide layer 12-1. The second element may be another one among the constituent elements of the aforementioned dielectric layer 15, except for oxygen. For example, the second oxide layer 13-1 may include zirconium oxide, for example, $ZrO_2$. The forming process of the second oxide layer 13-1 may be formed by an ALD method, and this will be described in detail with reference to FIG. 3 below.

Figure 3:
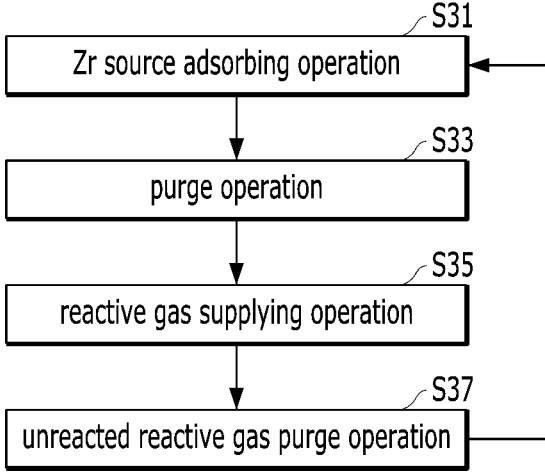
FIG. 3 is a flowchart illustrating a process for forming a second oxide layer of FIG. 1 according to an embodiment of the present disclosure.

FIG. 3 is a flowchart illustrating a process for forming the second oxide layer of FIG. 1 according to an embodiment of the present disclosure.

Referring to FIG. 3, the method may include a Zr source adsorbing operation S31 which includes a source of the second element, for example, the zirconium source into the chamber in which the first oxide layer is formed, and adsorbing it onto the first oxide layer. The zirconium source may be made of or include, for example, TEMAZ (Tetrakis EthylMethylAmino Zirconium), TDMAZ (Tetrakis DiMethylAmino Zirconium), or the like.

Subsequently, a purge operation S33 including the removing of any unadsorbed zirconium source may be performed.

Subsequently, in a reactive gas supplying operation S35, a reactive gas for reaction with the adsorbed zirconium source may be supplied into the chamber. The reactive gas may include an oxidizing agent. The oxidizing agent may include, for example, a gas or plasma including $O_3$, $O_2$, $H_2O$, $H_2O_2$, or a combination thereof.

Subsequently, a purge operation S37 of removing an unreacted reactive gas may be performed.

The operations S31 to S37 may be repeatedly performed until the second oxide layer 13-1 has the desired thickness T2. That is, the operations S31 to S37 may be regarded as one cycle, and, therefore, a plurality of cycles may be performed until the second oxide layer 13-1 reaches the desired thickness T2.

Returning to FIG. 1 again, referring to of FIG. 1(D), an additional oxidation process may be performed on the second oxide layer 13-1 (see arrow). Therefore, a ferroelectric property may be secured by compensating for oxygen vacancies in the second oxide layer 13-1 through this additional oxidation process.

The processes of FIGS. 1(A) to 1(D) may be repeated for a plurality of times to obtain the dielectric layer 15 having a desired target thickness. Thus, a structure in which a plurality of first oxide layers and a plurality of second oxide layers are alternately stacked over the first electrode layer 11 may be obtained, as shown, for example, in FIG. 1(E).

Referring to of FIG. 1(E), as the processes of FIGS. 1(A) to 1(D) are repeated three times, three first oxide layers 12-1, 12-2, and 12-3, and three second oxide layers 13-1, 13-2, and 13-3 may be alternately stacked over the first electrode layer 11. Here, each of the three first oxide layers 12-1, 12-2, and 12-3 may each have the thickness T1. That is, the three first oxide layers 12-1, 12-2, and 12-3 may have substantially the same thickness. Here, the meaning of "substantially the same" may include not only the completely identical, but also a slight difference, for example, a difference of ±10% or less. For example, when the thickness of the lowermost first oxide layer 12-1 among the three first oxide layers 12-1, 12-2, and 12-3 has a range of 90% to 110% of the thickness of the middle first oxide layer 12-2, it may be considered that the lowermost first oxide layer 12-1 and the middle first oxide layer 12-2 have substantially the same thickness. In this case, the number of cycles of the ALD process for forming each of the three first oxide layers 12-1, 12-2, and 12-3 may be the same as each other. In addition, each of the three second oxide layers 13-1, 13-2, and 13-3 may have the thickness T2. That is, the three second oxide layers 13-1, 13-2, and 13-3 may have substantially the same thickness. In this case, the number of cycles of the ALD process for forming each of the three second oxide layers 13-1, 13-2, and 13-3 may be the same as each other. Furthermore, for the first dielectric layer 15 to include the first element, such as hafnium, and the second element, such as zirconium, in a ratio of 1 to 1, the thickness T1 of each of the first oxide layers 12-1, 12-2, and 12-3 and the thickness T2 of each of the second oxide layers 13-1, 13-2, and 13-3 may also be substantially the same as each other. That is, the number of cycles of the ALD process for forming each of the three first oxide layers 12-1, 12-2, and 12-3 may be equal to the number of cycles of the ALD process for forming each of the three second oxide layers 13-1, 13-2, and 13-3.

Subsequently, the second electrode layer 14 may be formed over the uppermost second oxide layer 13-3.

Referring to FIG. 1(F), a heat treatment process may be performed on the process result structure of FIG. 1(E). During the heat treatment, by a chemical reaction between the first oxide layers 12-1, 12-2, and 12-3 and the second oxide layers 13-1, 13-2, and 13-3, an oxide including the first element of the first oxide layers 12-1, 12-2, and 12-3 and the second element of the second oxide layers 13-1, 13-2, and 13-3 may be formed. This oxide may form the dielectric layer 15. The thickness of the dielectric layer 15 may be substantially equal to the sum of the thicknesses of the first oxide layers 12-1, 12-2, and 12-3 and the thicknesses of the second oxide layers 13-1, 13-2, and 13-3. That is, the dielectric layer 15 may have the thickness of $3*T1+3*T2$.

However, in this comparative example, in the operation of performing the additional oxidation process on the lowermost first oxide layer 12-1 as shown in FIG. 1(B), oxygen may be diffused into the first electrode layer 11, and thus, a problem arises in that oxidation of the first electrode layer 11 may occur. When the first electrode layer 11 is oxidized, interfacial defects may occur between the dielectric layer 15 and the first electrode layer 11, which may in turn deteriorate the endurance of the capacitor 10 because the interfacial defects cause fatigue of the capacitor 10 by reducing the remnant polarization of the dielectric layer 15 when endurance cycles increase.

In the following embodiments, a capacitor capable of solving the problem of deterioration in endurance of the capacitor occurring in the comparative example, and a method for fabricating the same will be described.

Figure 4:
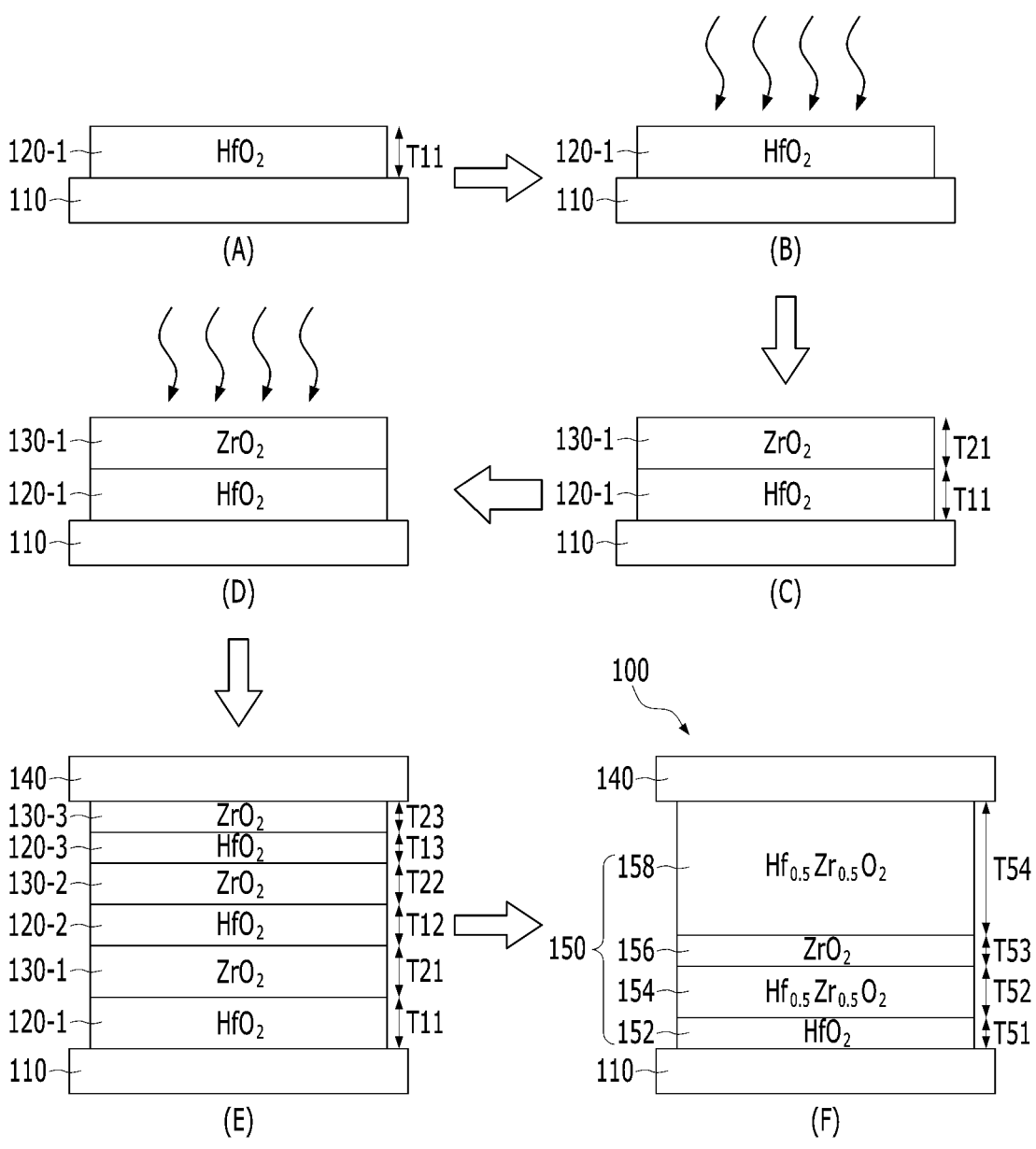
FIG. 4 is a simplified schematic illustrating a capacitor of a semiconductor device and a manufacturing method thereof according to an embodiment of the present disclosure.

FIG. 4 is a simplified schematic illustrating a capacitor of a semiconductor device and a manufacturing method thereof according to an embodiment of the present disclosure. FIG. 4(F) shows a capacitor, and FIGS. 4(A) to 4(E) show intermediate process operations for manufacturing the capacitor of FIG. 4(F). Differences from the comparative example will be mainly described.

Referring to FIG. 4(A), a first oxide layer 120-1 including a first element may be formed over a first electrode layer 110. For example, the first oxide layer 120-1 may include hafnium oxide, for example, $HfO_2$, and may have a thickness T11. The thickness T11 of the first oxide layer 120-1 may be greater than the thickness T1 of the first oxide layer 12-1 of the comparative example described above. Furthermore, the thickness T11 may have a value large enough to prevent oxygen from reaching the first electrode layer 110 during an additional oxidation process of FIG. 4(B) to be described later. The first oxide layer 120-1 may be formed by the ALD method described in FIG. 2. Here, when the operations S21 to S27 of FIG. 2 are referred to as one cycle, a plurality of cycles may be performed to make the first oxide layer 120-1 have the thickness T11.

Referring to FIG. 4(B), an additional oxidation process may be performed on the first oxide layer 120-1 (see arrow) to compensate for oxygen vacancies in the first oxide layer 120-1. Here, since the thickness T11 of the first oxide layer 120-1 is relatively large, diffusion of oxygen into the first electrode layer 110 may be reduced and/or prevented during the additional oxidation process. Accordingly, interfacial defects between the first oxide layer 120-1 and the first electrode layer 110 may be reduced and/or prevented.

Referring to FIG. 4(C), a second oxide layer 130-1 including a second element may be formed over the additionally oxidized first oxide layer 120-1. For example, the second oxide layer 130-1 may include zirconium oxide, for example, $ZrO_2$, and may have a thickness T21. The second oxide layer 130-1 may be formed by the ALD method described in FIG. 3. Here, when the operations S31 to S37 of FIG. 3 are referred to as one cycle, a plurality of cycles may be performed until the second oxide layer 130-1 reaches the thickness T21. The thickness T21 of the second oxide layer 130-1 may have substantially the same value as the thickness T11 of the first oxide layer 120-1, and the number of cycles of the ALD process performed to form the second oxide layer 130-1 may be the same as the number of cycles of the ALD process performed to form the first oxide layer 120-1.

Referring to FIG. 4(D), an additional oxidation process may be performed on the second oxide layer 130-1 (see arrow) to compensate for oxygen vacancies in the second oxide layer 130-1.

The processes of FIGS. 4(A) to 4(D) may be repeated a plurality of times to obtain a dielectric layer having a desired target thickness. Thus, a structure in which a plurality of first oxide layers and a plurality of second oxide layers are alternately stacked over the first electrode layer 11 may be obtained, as shown, for example, in FIG. 4(E).

Referring to FIG. 4(E), as the processes of FIGS. 4(A) to 4(D) are repeated three times, three first oxide layers 120-1, 120-2, and 120-3, and three second oxide layers 130-1, 130-2, and 130-3 may be alternately stacked over the first electrode layer 110.

Here, when the three first oxide layers 120-1, 120-2, and 120-3 have a first thickness T11, a second thickness T12, and a third thickness T13, respectively, the first thickness T11 may be greater than each of the second thickness T12 and the third thickness T13. That is, the lowermost first oxide layer 120-1 may have a greater thickness than each of the other first oxide layers 120-2 and 120-3. In this case, the number of cycles of the ALD process for forming the lowermost first oxide layer 120-1 may be greater than the number of cycles of the ALD process for forming each of the other first oxide layers 120-2 and 120-3. In the present embodiment, the case where the second thickness T12 is greater than the third thickness T13 is shown, and in this case, the number of cycles of the ALD process for forming the middle first oxide layer 120-2 may be greater than the number of cycles of the ALD process for forming the uppermost first oxide layer 120-3. However, the present disclosure is not limited thereto, and the second thickness T12 may be the same as the third thickness T13, or the second thickness T12 may be smaller than the third thickness T13. In this case, the number of cycles of the ALD process for forming the middle first oxide layer 120-2 may be equal to or smaller than the number of cycles of the ALD process for forming the uppermost first oxide layer 120-3.

In addition, when the three second oxide layers 130-1, 130-2, and 130-3 have a first thickness T21, a second thickness T22, and a third thickness T23, respectively, the first thickness T21 of the lowermost second oxide layer 130-1 may be substantially the same as the first thickness T11 of the lowermost first oxide layer 120-1, the second thickness T22 of the middle second oxide layer 130-2 may be substantially the same as the second thickness T12 of the middle first oxide layer 120-2, and the third thickness T23 of the uppermost second oxide layer 130-3 may be substantially the same as the third thickness T13 of the uppermost first oxide layer 120-3. This may be for the first element, for example, hafnium, and the second element, for example, zirconium, having a content of 1 to 1 in the dielectric layer to be described later. Accordingly, the lowermost second oxide layer 130-1 may have a greater thickness than each of the other second oxide layers 130-2 and 130-3. That is, the number of cycles of the ALD process for forming the lowermost second oxide layer 130-1 may be greater than the number of cycles of the ALD process for forming each of the other second oxide layers 130-2 and 130-3.

Subsequently, a second electrode layer 140 may be formed over the uppermost second oxide layer 130-3.

Referring to FIG. 4(F), a heat treatment process may be performed on the process result structure of FIG. 4(E).

During the heat treatment, by a chemical reaction between the first oxide layers 120-1, 120-2, and 120-3 and the second oxide layers 130-1, 130-2, and 130-3, an oxide including the first element of the first oxide layers 120-1, 120-2, and 120-3 and the second element of the second oxide layers 130-1, 130-2, and 130-3 may be formed.

Here, since the first thickness T11 of the lowermost first oxide layer 120-1 and the first thickness T21 of the lowermost second oxide layer 130-1 are relatively thick, during the reaction between the lowermost first oxide layer 120-1 and the lowermost second oxide layer 130-1, a lower portion of the lowermost first oxide layer 120-1 may remain as an oxide of the first element, such as hafnium oxide, without participating in the reaction. Similarly, an upper portion of the lowermost second oxide layer 130-1 may remain as an oxide of the second element, such as zirconium oxide, without participating in the reaction. The unreacted lower portion of the lowermost first oxide layer 120-1 may be referred to as a first remaining oxide layer 152, and the unreacted upper portion of the lowermost second oxide layer 130-1 may be referred to as a second remaining oxide layer. 156. An upper portion of the lowermost first oxide layer 120-1 and a lower portion of the lowermost second oxide layer 130-1 may react with each other to form an oxide of the first element and the second element, for example, hafnium zirconium oxide. The oxide of the first element and the second element formed by the reaction between the lowermost first oxide layer 120-1 and the lowermost second oxide layer 130-1 may be referred to as a first reactive oxide layer 154 hereinafter. A thickness T52 of the first reactive oxide layer 154 may be greater than a thickness T51 of the first remaining oxide layer 152 and a thickness T53 of the second remaining oxide layer 156. The first remaining oxide layer 152 and the second remaining oxide layer 156 may have a thickness that is small enough to correspond to an interfacial layer.

Since the other first oxide layers 120-2 and 120-3 and the other second oxide layers 130-2 and 130-3 have a relatively small thickness, the middle first oxide layer 120-2 and the middle second oxide layer 130-2 may completely react with each other so that unreacted portions may not exist, and the uppermost first oxide layer 120-3 and the uppermost second oxide layer 130-3 may completely react with each other so that unreacted portions may not exist. As a result, the other first oxide layers 120-2 and 120-3 and the other second oxide layers 130-2 and 130-3 may react with each other to form an oxide of the first element and the second element, such as hafnium zirconium oxide. The oxide of the first element and the second element formed by the reaction between the other first oxide layers 120-2 and 120-3 and the other second oxide layers 130-2 and 130-3 may be referred to as the second reactive oxide layer 158 hereinafter. A thickness T54 of the second reactive oxide layer 158 may be greater than the thickness T52 of the first reactive oxide layer 154.

The first remaining oxide layer 152, the first reactive oxide layer 154, the second remaining oxide layer 156, and the second reactive oxide layer 158 may form a dielectric layer 150. The thickness of the dielectric layer 150 may be substantially the same as the sum of the thicknesses of the first remaining oxide layer 152, the first reactive oxide layer 154, the second remaining oxide layer 156, and the second reactive oxide layer 158, that is, T51+T52+T53+T54. Further, the thickness of the dielectric layer 150 may be substantially the same as the sum of the thicknesses of the first oxide layers 120-1, 120-2, and 120-3 and the second oxide layers 130-1, 130-2, and 130-3. That is, the dielectric layer 150 may have a thickness of T11+T12+T13+T21+T22+T23.

According to the present embodiment, in the operation of performing the additional oxidation process on the lowermost first oxide layer 120-1 as shown in FIG. 4(B), diffusion of oxygen into the first electrode layer 110 and the resulting oxidation of the first electrode layer 110 may be prevented and/or reduced since the lowermost first oxide layer 120-1 has a relatively large thickness. As a result, the occurrence of interfacial defects between the dielectric layer 150 and the first electrode layer 110 may be prevented and/or reduced, thereby increasing endurance of the capacitor 100.

This increase in endurance of the capacitor 100 has been experimentally confirmed, and will be described with reference to FIGS. 5 and 6.

Figure 5:
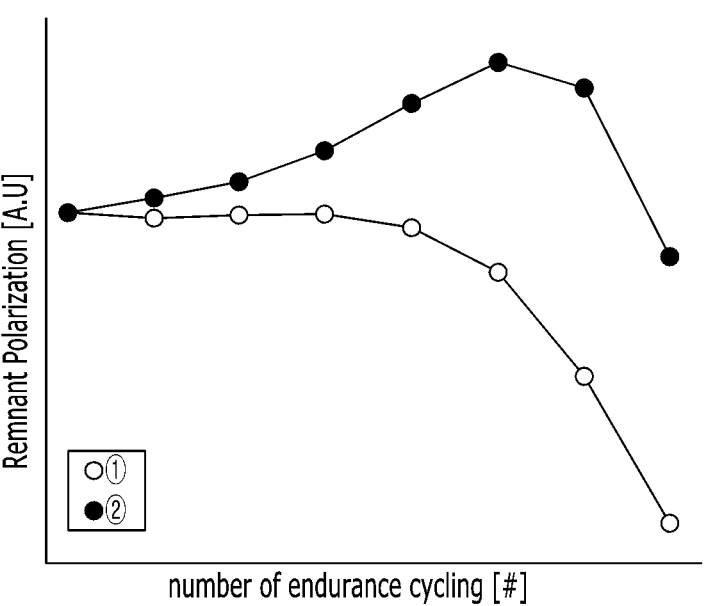
FIG. 5 is a graph showing remnant polarization according to the number of endurance cycling according to an embodiment of the present disclosure.

FIG. 5 is a graph showing remnant polarization according to the number of endurance cycling according to an embodiment of the present disclosure.

Referring to FIG. 5, when hafnium oxide and zirconium oxide having substantially the same thickness are repeatedly stacked as in the comparative example described above (see ①), it can be seen that the remnant polarization rapidly decreases when the number of endurance cycling exceeds a predetermined value.

On the other hand, when thick hafnium oxide and zirconium oxide are stacked by initially increasing the number of cycles of the ALD process, and then, thin hafnium oxide and zirconium oxide are stacked thereover as in the present embodiment (see ②), compared to the case of ①, it can be seen that the remnant polarization increases until the number of endurance cycling reaches a predetermined value. Furthermore, it can be seen that even if the number of endurance cycling further increases and the remnant polarization decreases, the remnant polarization is still greater than that of the case ①.

As a result, it can be seen that the endurance of the capacitor of the present embodiment is increased compared to the capacitor of the comparative example.

Figure 6:
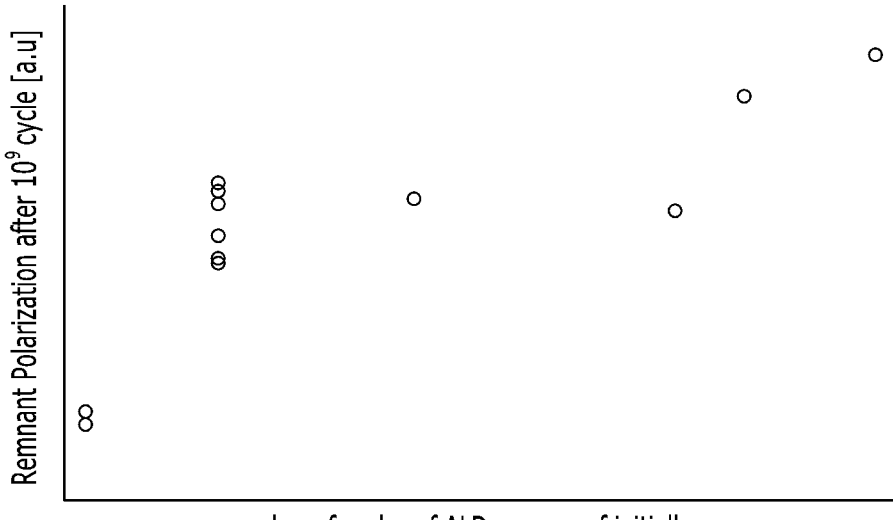
FIG. 6 is a graph showing remnant polarization according to the number of cycles of the ALD process of each of the initially formed hafnium oxide and zirconium oxide according to an embodiment of the present disclosure.

FIG. 6 is a graph showing remnant polarization according to the number of cycles of the ALD process of each of the initially formed hafnium oxide and zirconium oxide according to an embodiment of the present disclosure. FIG. 6 shows the remnant polarization when the number of endurance cycling is greater than $10^9$.

Referring to FIG. 6, it can be seen that the remnant polarization increases as the number of cycles of the ALD process for forming each of initially formed hafnium oxide and zirconium oxide increases.

As a result, it can be seen that the endurance of the capacitor increases when the thickness of each of the initially formed hafnium oxide and zirconium oxide are increased, as in the present embodiment.

Figure 7:
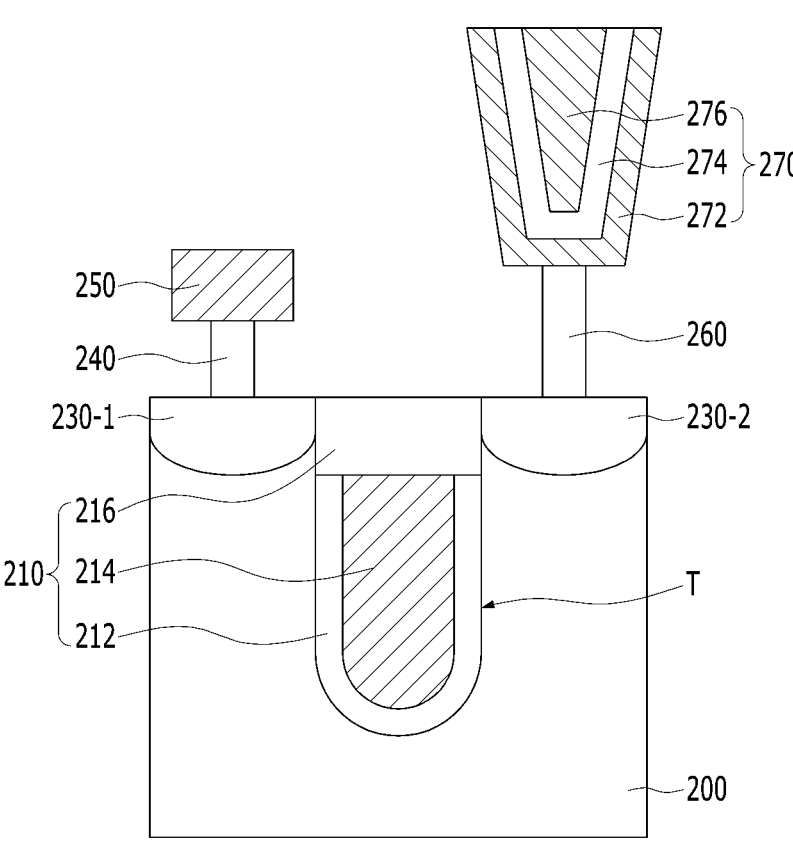
FIG. 7 is a simplified schematic illustrating a cross-sectional view of a semiconductor device according to an embodiment of the present disclosure.

FIG. 7 is a simplified schematic illustrating a cross-sectional view of a semiconductor device according to an embodiment of the present disclosure. The semiconductor device of FIG. 7 may include the capacitor described in FIG. 4.

Referring to FIG. 7, a semiconductor device of the present disclosure may include a substrate 200, a gate structure 210, first and second junction regions 230-1 and 230-2, a bit line contact 240, a bit line 250, a storage node contact 260, and a storage node 270.

The substrate 200 may include a semiconductor material such as silicon. For example, the substrate 200 may be a bulk silicon substrate, a silicon on insulator (SOI) substrate, or the like.

The gate structure 210 may be formed in the substrate 200, and may include a gate electrode 214, a gate insulating layer 212, and a gate protective layer 216.

The gate insulating layer 212 may be formed conformably along a surface of a trench T formed in the substrate 200. The gate insulating layer 212 may be formed from the bottom surface of the trench T to a predetermined height that is lower than the top surface of the substrate 200. The gate insulating layer 212 may be made of any suitable insulating material including, for example, a silicon oxide layer, a silicon nitride layer, a silicon oxynitride layer, a high dielectric constant material, or a combination thereof. The high dielectric constant material may include a material having a higher dielectric constant than silicon dioxide ($SiO_2$), for example, $HfO_2$, $HfSiO_4$, HfAlO, $ZrO_2$, $ZrSiO_4$, $TaO_2$, $Ta_2O_5$, $Al_2O_3$, or the like.

The gate electrode 214 may be formed in the trench T in which the gate insulating layer 212 is formed. The gate electrode 214 may be formed to fill a portion of the trench T in which the gate insulating layer 212 is formed. The gate electrode 214 may be formed to have a top surface height equal to or similar to that of the gate insulating layer 212. The gate electrode 214 may be made from any suitable conductive material including, for example, a metal such as platinum (Pt), tungsten (W), aluminum (Al), copper (Cu), tantalum (Ta), titanium (Ti), ruthenium (Ru), and molybdenum (Mo), a metal nitride such as titanium nitride (TiN) and tantalum nitride (TaN), or a combination thereof.

The gate protective layer 216 may be formed to fill the remaining space of the trench T in which the gate electrode 214 and the gate insulating layer 212 are formed. The gate protective layer 216 may perform a function of protecting the gate electrode 214 and the gate insulating layer 212 by covering them. The gate protection layer 216 may include various insulating materials, for example, a silicon nitride layer, a silicon oxynitride layer, or a combination thereof.

The trench T and the gate structure 210 may have a line shape extending in a direction penetrating this cross section. The gate electrode 214 may function as a word line.

The gate structure 210 and the first and second junction regions 230-1 and 230-2 formed in the substrate 200 on both sides of the gate structure 210 may form one transistor. One of the first and second junction regions 230-1 and 230-2 may function as a source region and the other may function as a drain region.

The bit line contact 240 may be connected to one of the first and second junction regions 230-1 and 230-2 of the transistor, for example, the first junction region 230-1, and the storage node contact 260 may be connected to the other one of the first and second junction regions 230-1 and 230-2 of the transistor, for example, the second junction region 230-2. Each of the bit line contact 240 and the storage node contact 260 may include various conductive materials, for example, a metal such as platinum (Pt), tungsten (W), aluminum (Al), copper (Cu), tantalum (Ta), titanium (Ti), ruthenium (Ru), and molybdenum (Mo), a metal nitride such as titanium nitride (TiN) and tantalum nitride (TaN), or a combination thereof.

The bit line 250 may be formed to be connected to the bit line contact 240 over the bit line contact 240. The bit line 250 may extend in the same direction as the gate electrode 214 functioning as a word line or in a direction crossing the gate electrode 214 at a predetermined angle. The bit line 250 may include various conductive materials, for example, a metal such as platinum (Pt), tungsten (W), aluminum (Al), copper (Cu), tantalum (Ta), titanium (Ti), ruthenium (Ru), and molybdenum (Mo), a metal nitride such as titanium nitride (TiN) and tantalum nitride (TaN), or a combination thereof.

The storage node 270 may be formed to be connected to the storage node contact 260 over the storage node contact 260. The storage node 270 may include the capacitor of the above-described embodiment. That is, the storage node 270 may include first and second electrode layers 272 and 276 and a dielectric layer 274 interposed therebetween. The dielectric layer 274 may be formed by the process of FIG. 4, and may have ferroelectricity. In the present embodiment, the case where the storage node 270 has a cylindrical capacitor has been described. That is, the storage node 270 may be formed by forming a hole exposing the storage node contact 260 by etching an insulating layer, sequentially forming the first electrode layer 272 and the dielectric layer 274 along the inner wall of the hole, and forming the second electrode layer 276 filling the remaining space of the hole. However, the present disclosure is not limited thereto, and the storage node 270 may include a capacitor having various shapes, such as a planar capacitor.

According to the above embodiments of the present disclosure, it may be possible to provide a semiconductor device including a capacitor having improved endurance, and a method for fabricating the same.

Although various embodiments have been described for illustrative purposes, it will be apparent to those skilled in the art that various changes and modifications may be made without departing from the spirit and scope of the present teachings as defined in the following claims. Furthermore, the embodiments may be combined to form additional embodiments.

What is claimed is:

1. A method for fabricating a semiconductor device, comprising:
   forming a first oxide layer including a first element over a first electrode layer;
   forming a second oxide layer including a second element over the first oxide layer;
   forming a stacked structure in which a plurality of first oxide layers and a plurality of second oxide layers are alternately stacked by repeating the forming of the first oxide layer and the forming of the second oxide layer a plurality of times; and
   forming a second electrode layer over the stacked structure,
   wherein a thickness of a lowermost first oxide layer among the plurality of first oxide layers is greater than a thickness of each of other first oxide layers.

2. The method according to claim 1, wherein the forming of the first oxide layer is performed by an Atomic Layer Deposition (ALD) process, and
   wherein the number of cycles of the ALD process for forming the lowermost first oxide layer is greater than the number of cycles of the ALD process for forming each of the other first oxide layers.

3. The method according to claim 1, wherein a thickness of a lowermost second oxide layer among the plurality of second oxide layers is greater than a thickness of each of other second oxide layers.

4. The method according to claim 3, wherein the forming of the second oxide layer is performed by an ALD process, and
   wherein the number of cycles of the ALD process for forming the lowermost second oxide layer is greater than the number of cycles of the ALD process for forming each of the other second oxide layers.

5. The method according to claim 1, wherein a thickness of the lowermost first oxide layer is in a range of 90% to 110% of a thickness of a lowermost second oxide layer among the plurality of second oxide layers.

6. The method according to claim 1, wherein a thickness of a Nth first oxide layer among the plurality of first oxide layers is in a range of 90% to 110% of a thickness of a Nth second oxide layer among the plurality of second oxide layers.

7. The method according to claim 1, wherein thicknesses of the plurality of first oxide layers decrease from bottom to top.

8. The method according to claim 1, wherein thicknesses of the plurality of second oxide layers decrease from bottom to top.

9. The method according to claim 1, further comprising:
   performing a heat treatment on the stacked structure to form a dielectric layer including an oxide of the first element and the second element.

10. The method according to claim 1, further comprising:
   performing a heat treatment on the stacked structure,
   wherein, during the heat treatment, a first reactive oxide layer including an oxide of the first element and the second element is formed by a reaction between an upper portion of the lowermost first oxide layer and a lower portion of a lowermost second oxide layer among the plurality of second oxide layers,
   wherein a lower portion of the lowermost first oxide layer remains under the first reactive oxide layer, and
   wherein an upper portion of the lowermost second oxide layer remains over the first reactive oxide layer.

11. The method according to claim 10, wherein, during the heat treatment, a second reactive oxide layer including an oxide of the first element and the second element is formed by a reaction between the other first oxide layers and the other second oxide layers.

12. The method according to claim 1, further comprising:
   performing an additional oxidation process for compensating for oxygen vacancies in the first oxide layer after the forming of the first oxide layer; and
   performing an additional oxidation process for compensating for oxygen vacancies in the second oxide layer after the forming of the second oxide layer.

13. The method according to claim 1, wherein the first oxide layer includes hafnium oxide, and
   wherein the second oxide layer includes zirconium oxide.

* * * * *